(12) United States Patent
Haga

(10) Patent No.: US 11,675,020 B2
(45) Date of Patent: Jun. 13, 2023

(54) BATTERY DEGRADATION EVALUATION SYSTEM, BATTERY DEGRADATION EVALUATION METHOD, AND NON-TRANSITORY STORAGE MEDIUM STORING BATTERY DEGRADATION EVALUATION PROGRAM

(71) Applicant: TOYOTA JIDOSHA KABUSHIKI KAISHA, Toyota (JP)

(72) Inventor: Nobuyasu Haga, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/895,591

(22) Filed: Aug. 25, 2022

(65) Prior Publication Data
US 2022/0404429 A1 Dec. 22, 2022

Related U.S. Application Data

(63) Continuation of application No. 17/131,963, filed on Dec. 23, 2020, now Pat. No. 11,460,514.

(30) Foreign Application Priority Data

Feb. 6, 2020 (JP) .............................. JP2020-018737

(51) Int. Cl.
*G01R 31/392* (2019.01)
*G01R 31/367* (2019.01)
(Continued)

(52) U.S. Cl.
CPC .......... *G01R 31/392* (2019.01); *B60R 16/033* (2013.01); *G01R 31/367* (2019.01); *H02J 7/005* (2020.01)

(58) Field of Classification Search
CPC ..... G01R 31/392; G01R 31/367; H02J 7/005; B60R 13/033
See application file for complete search history.

(56) References Cited

U.S. PATENT DOCUMENTS 10,901,038 B2   1/2021   Kong et al.
2013/0135110 A1 *  5/2013   Xie ...................... G08B 29/181
                                                340/636.11
(Continued)

FOREIGN PATENT DOCUMENTS

EP      3611524 A1     2/2020
JP      2018-179733 A  11/2018

*Primary Examiner* — Raymond L Nimox
(74) *Attorney, Agent, or Firm* — Oliff PLC

(57) ABSTRACT

A battery degradation evaluation system includes a memory and a processor. The processor is configured to acquire state quantities of a battery mounted at a vehicle, derive probabilities, and evaluate degradation of the battery based on the derivation results. The probabilities are a short-term degradation probability of the battery degrading in a pre-specified short period, a medium-term degradation probability of the battery degrading in a period that is longer than the short period, and a long-term degradation probability of the battery degrading in a period that is longer than the medium period. When a number of the state quantities is smaller, the processor sets a higher weighting for a combined degradation probability for the short period and medium period, which is calculated from the long-term degradation probability. When the number of state quantities is larger, the processor sets a higher weighting for the short-term degradation probability.

12 Claims, 13 Drawing Sheets

(51) Int. Cl.
  *H02J 7/00*    (2006.01)
  *B60R 16/033*  (2006.01)

(56) References Cited

U.S. PATENT DOCUMENTS

| | | | |
|---|---|---|---|
| 2015/0301122 A1* | 10/2015 | Lee | G01R 31/392 |
| | | | 702/63 |
| 2016/0041231 A1 | 2/2016 | Lee | |
| 2016/0195587 A1 | 7/2016 | Lee | |
| 2016/0356856 A1 | 12/2016 | Hongo | |
| 2017/0126027 A1* | 5/2017 | Park | G01R 31/392 |
| 2019/0212391 A1* | 7/2019 | Koller | B60L 58/16 |
| 2019/0329669 A1* | 10/2019 | Soeda | G06Q 20/29 |
| 2021/0048482 A1* | 2/2021 | Ukumori | H01M 10/42 |
| 2022/0041078 A1* | 2/2022 | Ukumori | G01R 31/367 |

* cited by examiner

BATTERY DEGRADATION EVALUATION SYSTEM, BATTERY DEGRADATION EVALUATION METHOD, AND NON-TRANSITORY STORAGE MEDIUM STORING BATTERY DEGRADATION EVALUATION PROGRAM

CROSS-REFERENCE TO RELATED APPLICATION

This is a Continuation of application Ser. No. 17/131,963 filed Dec. 23, 2020, which claims the benefit of Japanese Application No. 2020-018737 filed Feb. 6, 2020. The disclosures of the prior applications are hereby incorporated by reference herein in their entireties.

BACKGROUND

Technical Field

The present disclosure relates to a battery degradation evaluation system for evaluating degradation of a battery such as an auxiliary battery of a vehicle or the like, a battery degradation assessment method, and a non-transitory storage medium storing a battery degradation assessment program.

Related Art

For example, Japanese Patent Application Laid-Open (JP-A) No. 2018-179733 proposes a battery life assessment device including: a storage unit that stores durations of use of a battery that are measured at time intervals and measured values of a degradation index that are measured at the time intervals, the degradation index representing degradation of the battery; and a processing unit that assesses a life of the battery. Based on the durations of use of the battery and the measured values of the degradation index, the processing unit finds changes over time of the degradation index. Based on the changes over time of the degradation index, the processing unit finds a corresponding prediction function of the degradation index for the individual battery. Based on of the degradation index prediction function, the processing unit finds predicted values of the degradation index, and based on the predicted values of the degradation index, the processing unit assesses the life of the battery.

However, there is scope for improvement of the technology disclosed in JP-A No. 2018-179733 in that degradation of a battery may not be evaluated until information on internal resistances, which serve as the measured values of the degradation index, has been accumulated, and even if evaluation is possible, evaluation accuracy is poor.

SUMMARY

The present disclosure provides a battery degradation evaluation device, a battery degradation evaluation method, and a non-transitory storage medium storing a battery degradation evaluation program that may accurately evaluate degradation of a battery even when plentiful data has not been collected.

A battery degradation evaluation device according to a first aspect includes: an acquisition section that acquires state quantities of a battery mounted at a vehicle; a derivation section that, based on the state quantity acquired by the acquisition section and a pre-specified computation model, derives each of a short-term degradation probability of the battery degrading in a pre-specified short period, a medium-term degradation probability of the battery degrading in a medium period that is longer than the short period, and a long-term degradation probability of the battery degrading in a long period that is longer than the medium period; and an evaluation section that evaluates degradation of the battery based on derivation results from the derivation section, the evaluation section setting a higher weighting for a combined degradation probability for the short period and medium period when a number of the state quantity is smaller, the combined degradation probability being calculated from the long-term degradation probability, and setting a higher weighting for the short-term degradation probability when the number of state quantities is larger, the state quantities being used as data for learning of the computation model.

According to the first aspect, the acquisition section acquires the state quantity of the battery. The acquired state quantity is a physical quantity that changes in association with degradation of the battery. For example, voltage, resistance, temperature and the like of the battery can be mentioned as examples.

Based on each state quantity acquired by the acquisition section and the pre-specified computation model, the derivation section derives the short-term degradation probability of the battery degrading in the pre-specified short period, the medium-term degradation probability of the battery degrading in the medium period that is longer than the short period, and the long-term degradation probability of the battery degrading in the long period that is longer than the medium period (in other words, a probability of the battery not degrading until the long period).

The evaluation section evaluates degradation of the battery based on the derived results from the derivation section, setting a higher weighting for a combined degradation probability for the short period and medium period, which is calculated from the long-term degradation probability (100 minus the long-term degradation probability), when a number of the state quantities being used as data in learning by the computation model is smaller, and setting a higher weighting for the short-term degradation probability when the number of state quantities is larger. As a result, degradation of the battery may be evaluated using more accurate degradation probabilities. Thus, even when the number of state quantities is small, degradation of the battery may be evaluated accurately.

As in a second aspect, when the number of state quantities is less than a pre-specified threshold, the evaluation section may evaluate degradation of the battery based on the combined degradation probability for the short period and medium period that is calculated from the long-term degradation probability, and when the number of state quantities is equal to or greater than the threshold, the evaluation section may evaluate degradation of the battery based on the short-term degradation probability. Thus, battery degradation evaluation accuracy may be improved.

As in a third aspect, once the computation model starts learning, the computation model may conduct learning with training data including state quantities of a degrading battery mounted at a different vehicle that is different from the evaluation object vehicle and state quantities of an undegraded battery at the evaluation object vehicle, and in accordance with the progress of learning, the computation model may conduct learning with state quantities of the degrading battery at the evaluation object vehicle replacing state quantities of the battery mounted at the different vehicle in the learning data. Thus, amounts of data during learning may be assured and degradation evaluation accuracy in an initial period may be improved. As in a fourth aspect, in accordance with the progress of learning, the computation model may conduct learning with an increased number of the state quantities of the degrading battery at the evaluation object vehicle and a decreased number of the state quantities of the undegraded battery at the evaluation object vehicle. Thus, processing loads may be reduced.

As in a fifth aspect, the state quantity that the acquisition section acquires may be detected by a sensor mounted at the vehicle.

As in a sixth aspect, the present disclosure may be a battery degradation evaluation method that causes a computer to execute processing including: acquiring state quantities of a battery; based on the acquired state quantity and a pre-specified computation model, deriving each of a short-term degradation probability of the battery degrading in a pre-specified short period, a medium-term degradation probability of the battery degrading in a medium period that is longer than the short period, and a long-term degradation probability of the battery degrading in a long period that is longer than the medium period; and evaluating degradation of the battery based on the derived short-term degradation probability and long-term degradation probability, the evaluating including setting a higher weighting for a combined degradation probability for the short period and medium period when a number of the state quantity is smaller, the combined degradation probability being calculated from the long-term degradation probability, and setting a higher weighting for the short-term degradation probability when the number of state quantities is larger, the state quantities being used as data for learning of the computation model.

Alternatively, as in a seventh aspect, the present disclosure may be a non-transitory storage medium storing a battery degradation evaluation program executable by a processor to perform battery degradation evaluation processing, the battery degradation evaluation processing comprises acquiring state quantities of a battery; based on the acquired state quantity and a pre-specified computation model, deriving each of a short-term degradation probability of the battery degrading in a pre-specified short period, a medium-term degradation probability of the battery degrading in a medium period that is longer than the short period, and a long-term degradation probability of the battery degrading in a long period that is longer than the medium period; and evaluating degradation of the battery based on the derived short-term degradation probability and long-term degradation probability, the evaluating including setting a higher weighting for a combined degradation probability for the short period and medium period when a number of the state quantity is smaller, the combined degradation probability being calculated from the long-term degradation probability, and setting a higher weighting for the short-term degradation probability when the number of state quantities is larger, the state quantities being used as data for learning of the computation model.

According to the present disclosure as described above, a battery degradation evaluation device, battery degradation evaluation method, and non-transitory storage medium storing a battery degradation evaluation program may be provided that may accurately evaluate degradation of a battery even when plentiful data has not been collected.

BRIEF DESCRIPTION OF THE DRAWINGS

Exemplary embodiments of the present invention will be described in detail based on the following figures, wherein.

DETAILED DESCRIPTION

Figure 1:
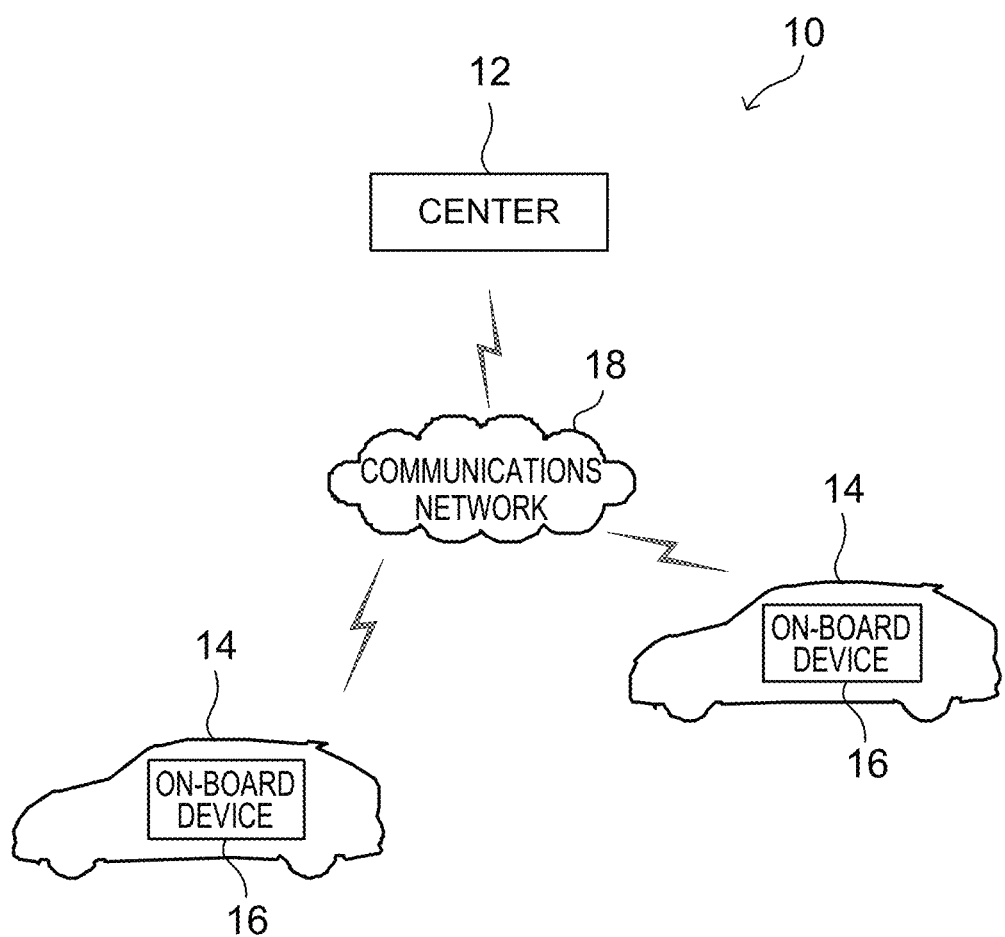
FIG. 1 is a diagram showing schematic structures of a battery degradation evaluation system according to a present exemplary embodiment.

Below, an example of an embodiment of the present disclosure is described in detail with reference to the attached drawings. FIG. 1 is a diagram showing schematic structures of a battery degradation evaluation system according to the present exemplary embodiment.

In a battery degradation evaluation system 10 according to the present exemplary embodiment, an on-board device 16 mounted at a vehicle 14 is connected with a center 12 via a communications network 18. In the battery degradation evaluation system 10 according to the present exemplary embodiment, state quantities of batteries mounted at multiple on-board devices 16 are sent to the center 12, and the center 12 evaluates degradation of the batteries. The center 12 employs big data of state quantities of batteries gathered from multiple vehicles and machine learning based on artificial intelligence (AI) to evaluate degradation of the batteries, using the state quantities of the batteries as input values.

In the present exemplary embodiment, a case of application to, for example, an auxiliary lead storage battery of the vehicle 14 is described. The state quantity is a state quantity representing a state of a battery. In particular, the state quantity is a physical quantity that changes in association with degradation of the battery. For example, voltage, resistance, temperature and the like of the battery can be mentioned as examples. In the present exemplary embodiment, an example in which the state quantity is, as an example, a voltage of the battery is described.

Figure 2:
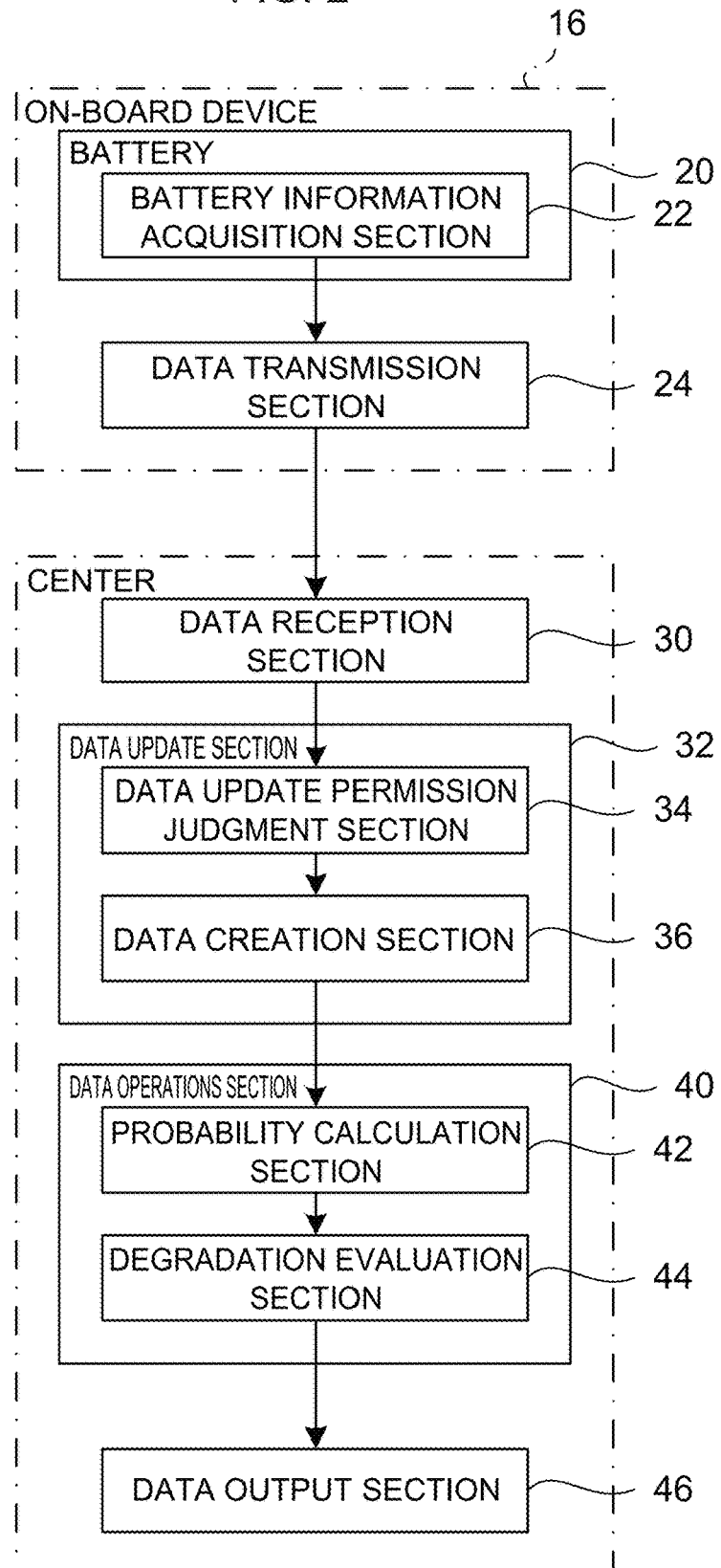
FIG. 2 is a block diagram showing functional structures of an on-board device and a center of the battery degradation evaluation system according to the present exemplary embodiment.
Figure 13:
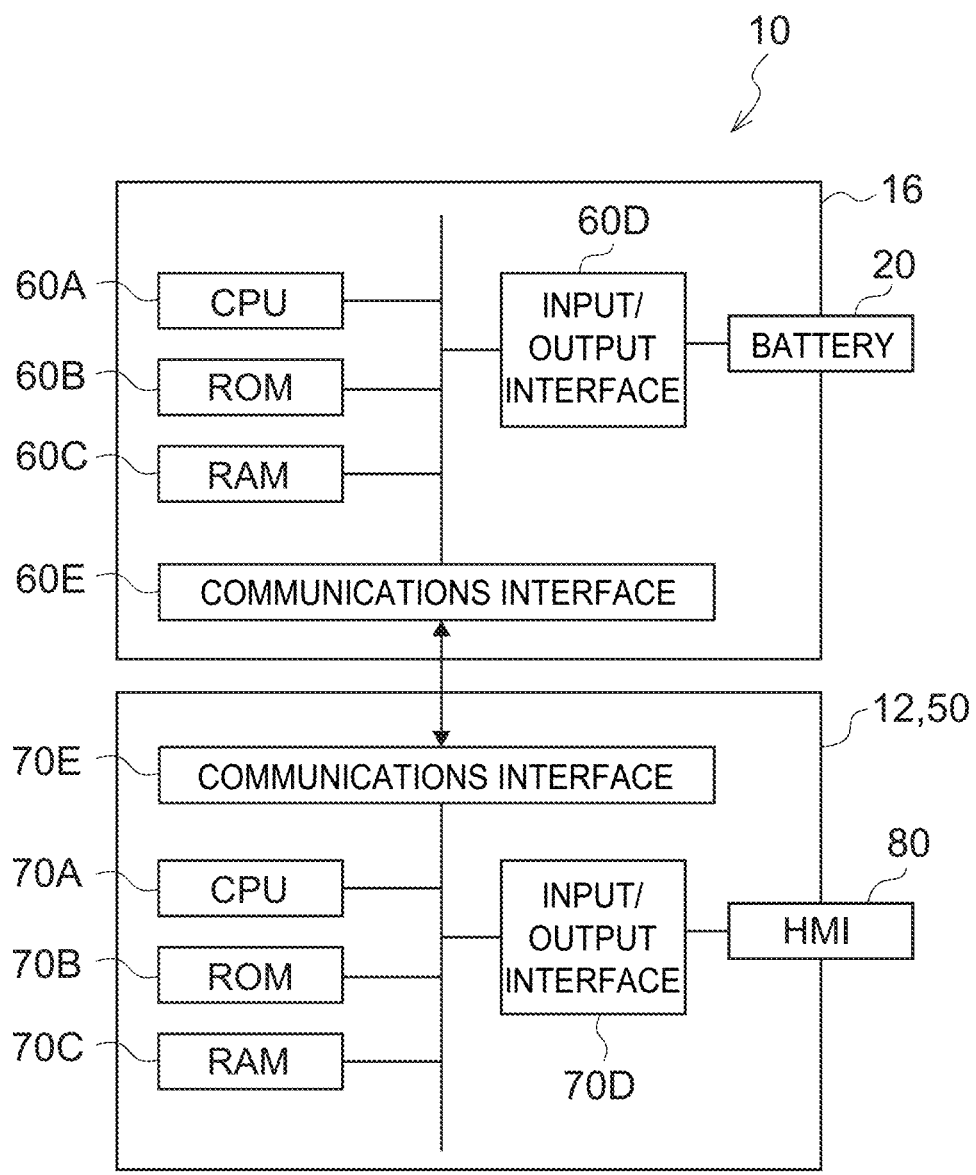
FIG. 13 is a block diagram showing hardware structures of the degradation evaluation system according to the present exemplary embodiment.

FIG. 2 is a block diagram showing structures of the on-board device 16 and center 12 of the battery degradation evaluation system 10 according to the present exemplary embodiment. FIG. 13 is a block diagram showing hardware structures of the battery degradation evaluation system 10 according to the present exemplary embodiment.

As shown in FIG. 13, the on-board device 16 is constituted by a microcomputer including a central processing unit (CPU) 60A that serves as a processor, read-only memory (ROM) 60B and random access memory (RAM) 60C that serve as memory, an input/output interface 60D, a communications interface 60E and so forth. The CPU 60A features the functions of a battery information acquisition section 22 and a data transmission section 24.

As shown in FIG. 2, the battery information acquisition section 22 acquires state quantities of a battery 20 mounted at the vehicle 14, which are voltages of the battery 20, to serve as battery information. The battery information acquisition section 22 acquires the voltages of the battery 20 with, for example, a voltage sensor. The battery information acquisition section 22 may be further provided with a temperature sensor that detects a temperature of the battery 20 and may acquire temperatures of the battery 20.

The data transmission section 24 sends the battery information acquired by the battery information acquisition section 22 to the center 12 via the communications network 18.

As shown in FIG. 13, the center 12 is constituted by a computer including a CPU 70A that serves as a processor, ROM 70B and RAM 70C that serve as memory, an input/output interface 70D, a communications interface 70E and so forth. The input/output interface 70D may be connected with a human-machine interface (HMI) such as a monitor 80 provided with a touch panel or the like. The CPU 70A functions as a data reception section 30, a data update section 32, a data operations section 40 and a data output section 46.

As shown in FIG. 2, the data reception section 30 acquires the battery information representing the state quantities of the battery 20 from the on-board device 16 of the vehicle 14, by receiving the battery information sent from the data transmission section 24 of the on-board device 16 via the communications network 18. Below, a case in which the battery information is a state quantity of the battery 20 is described.

The data update section 32 features functions of a data update permission judgment section 34 and a data creation section 36. The data update section 32 executes replacements of training data and machine learning based on AI, and carries out processing to update an AI data map.

Data of the state quantities of the batteries 20 is gathered from the on-board devices 16 of all vehicles 14 being administered by the center 12. The data update permission judgment section 34 carries out processing to identify the batteries 20 that may be degrading, and accordingly judges the appropriateness of a data update.

Figure 3:
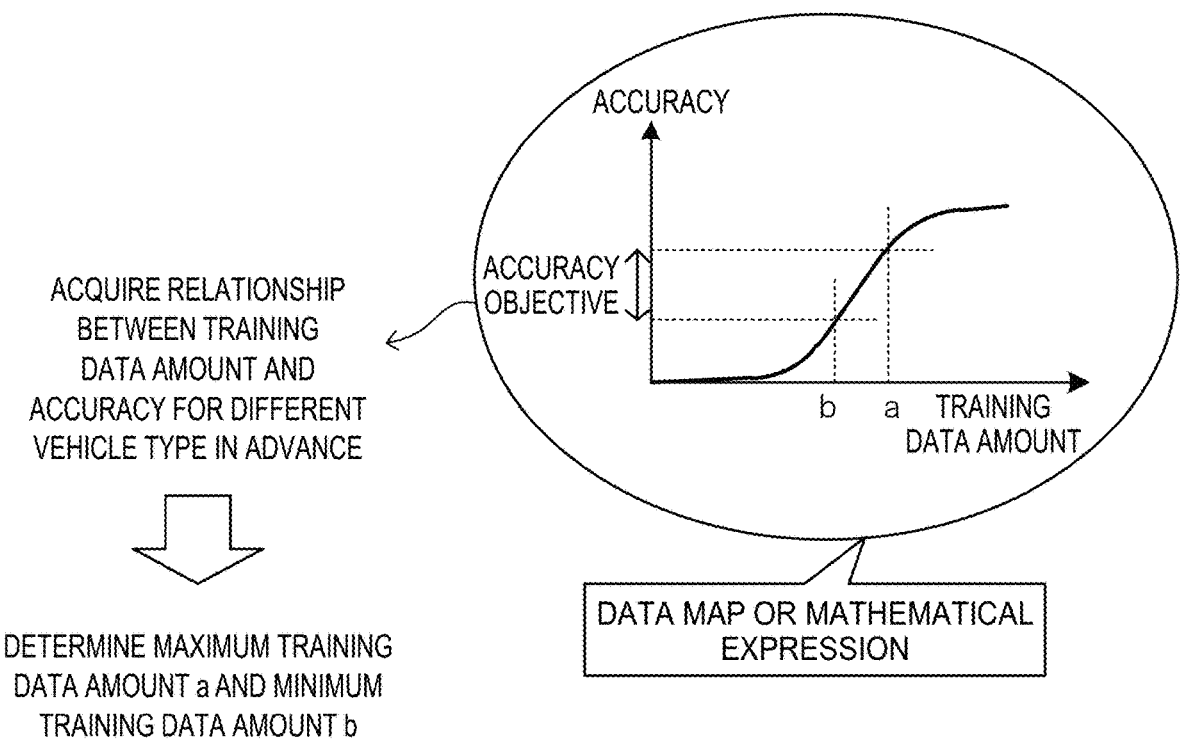
FIG. 3 is a diagram for describing a method of determining a maximum value a and a minimum value b of training data.

When a data update is judged to be appropriate by the data update permission judgment section 34, the data creation section 36 carries out processing to replace training data and conduct machine learning. That is, training data is replaced and the data creation section 36 creates a data map by machine learning based on an AI model, which serves as a pre-specified computation model, such as a neural network, a convolutional neural network (CNN) or the like. In the present exemplary embodiment, there are two types of training data replacement. The data creation section 36 switches between a first training data replacement and a second training data replacement in accordance with an amount of degrading data being used as training data. More specifically, as illustrated in FIG. 3, a function (a data map or a mathematical expression) of amounts of training data and accuracy is acquired in advance for each of different types of vehicle. For each function, a maximum value a and minimum value b of training data amounts corresponding with accuracy objectives are determined. When a degrading data amount N is $0 \le N \le b$, the data creation section 36 switches to the first training data replacement, and when the degrading data amount N is $b < N \le a$, the data creation section 36 switches to the second training data replacement.

Figure 4:
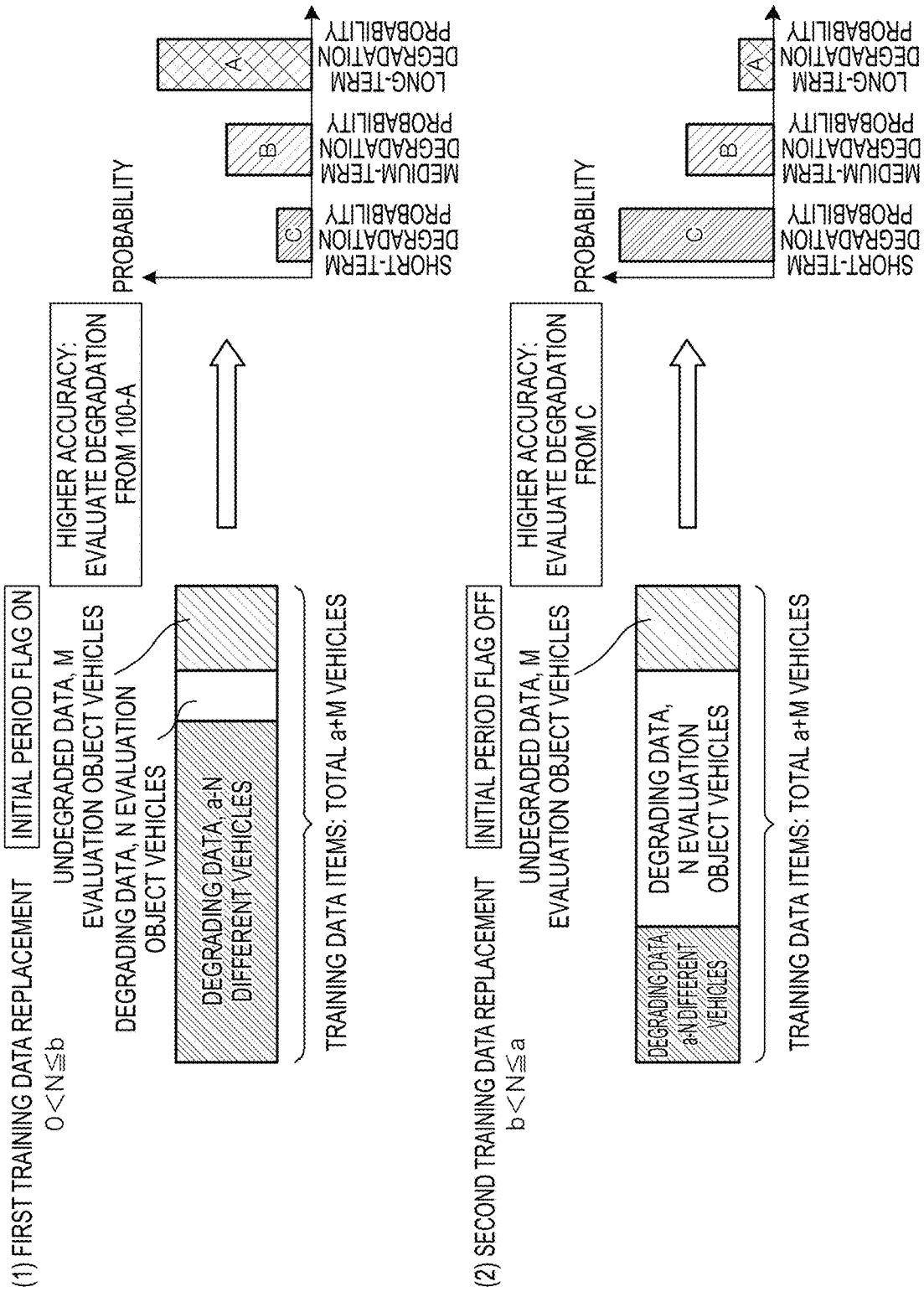
FIG. 4 is a diagram for describing a first training data replacement and a second training data replacement.

In the present exemplary embodiment, in an initial state in which there is little training data obtained from degrading data of the evaluation object vehicles, degrading data of different vehicles of other vehicle types or the like is added to the training data to create a data map, as in the first training data replacement illustrated in FIG. 4. In FIG. 4, the total number of items of training data represents training data of (a+M) vehicles: degrading data of (a−N) of the different vehicles, degrading data of (N) of the evaluation object vehicles, and undegraded data of (M) of the evaluation object vehicles. As more degrading data is collected, the data map is created with the degrading data of the different vehicles being replaced with degrading data of the evaluation object vehicles, as in the second training data replacement illustrated in FIG. 4.

The data operations section 40 features functions of a probability calculation section 42 and a degradation evaluation section 44 (see FIG. 2). The data operations section 40 evaluates degradation of each battery 20 based on the state quantities acquired from the on-board device 16.

Figure 5:
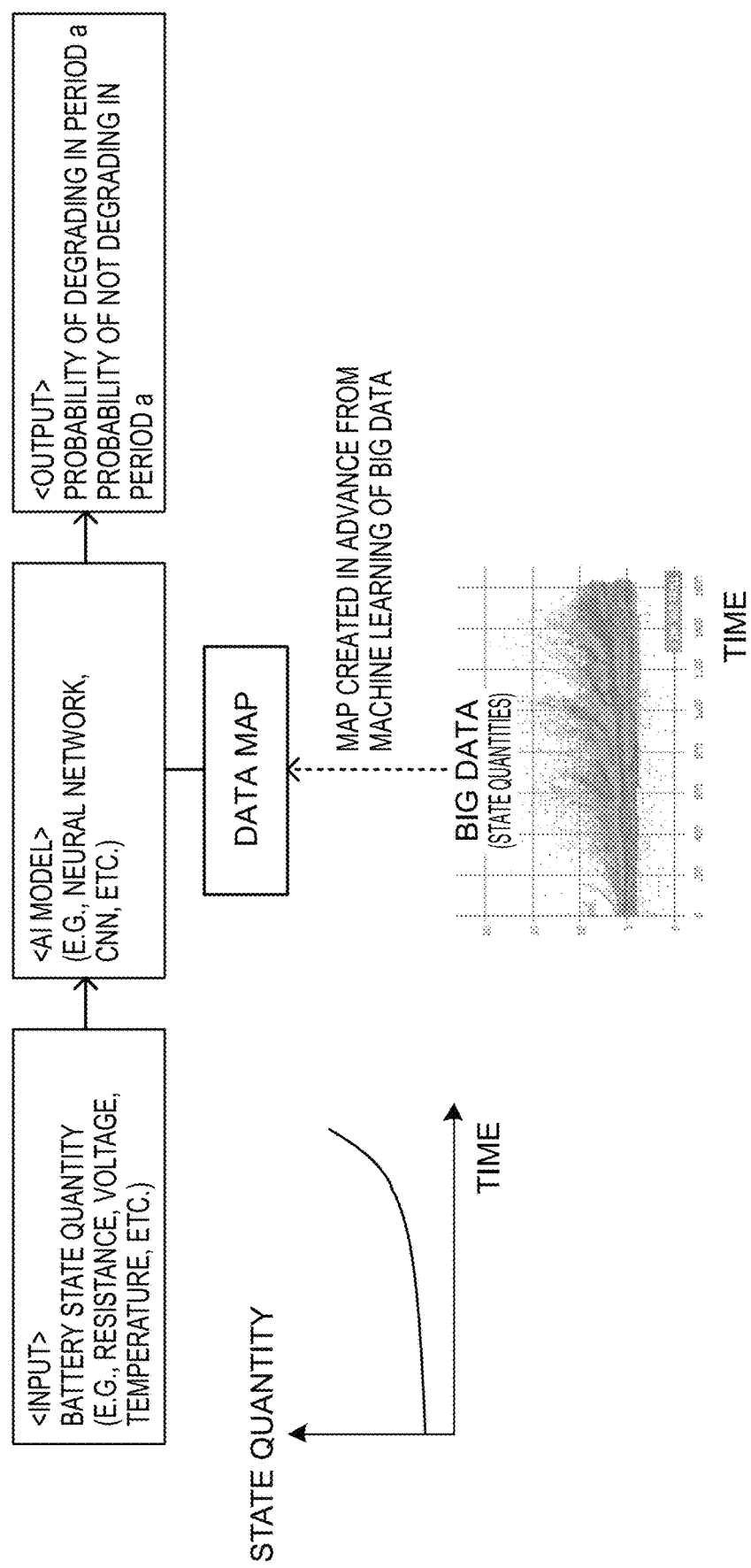
FIG. 5 is a diagram showing an example of calculation of a degradation probability by a probability calculation section.

As shown in FIG. 5, the probability calculation section 42 uses the data map created by the data creation section 36, with a state quantity of the battery 20 as an input, to calculate degradation probabilities. The degradation probabilities that are calculated are, for example, a probability of degrading in a pre-specified period a, the probability of not degrading in the period a, and the like. For example, a usage period of the battery 20 is divided into three pre-specified divisions and the probability calculation section 42 calculates three kinds of probability: a short-term degradation probability, a medium-term degradation probability and a long-term degradation probability. In an initial period when there is little training data obtained from degrading data of the evaluation object vehicles, a relatively large quantity of the training data is obtained from undegraded data of the evaluation object vehicles. Thus, as with the first training data replacement shown in FIG. 4, a model accuracy with the long-term degradation probability is higher than a model accuracy with the short-term degradation probability. Therefore, the long-term degradation probability with higher accuracy (in other words, a probability of not degrading until the long term) is employed. On the other hand, when the probability calculation section 42 has collected training data obtained from degrading data of the evaluation object vehicles, as with the second training data replacement shown in FIG. 4, the model accuracy of the short-term degradation probability is improved. Therefore, the short-term degradation probability is employed. In the present exemplary embodiment, an example is described in which the probability calculation section 42 calculates the three kinds of probability—the short-term degradation probability, the medium-term degradation probability and the long-term degradation probability—but this is not limiting. The usage period of the battery 20 may be divided into four periods or more, and four or more kinds of probability may be calculated.

Figure 11:
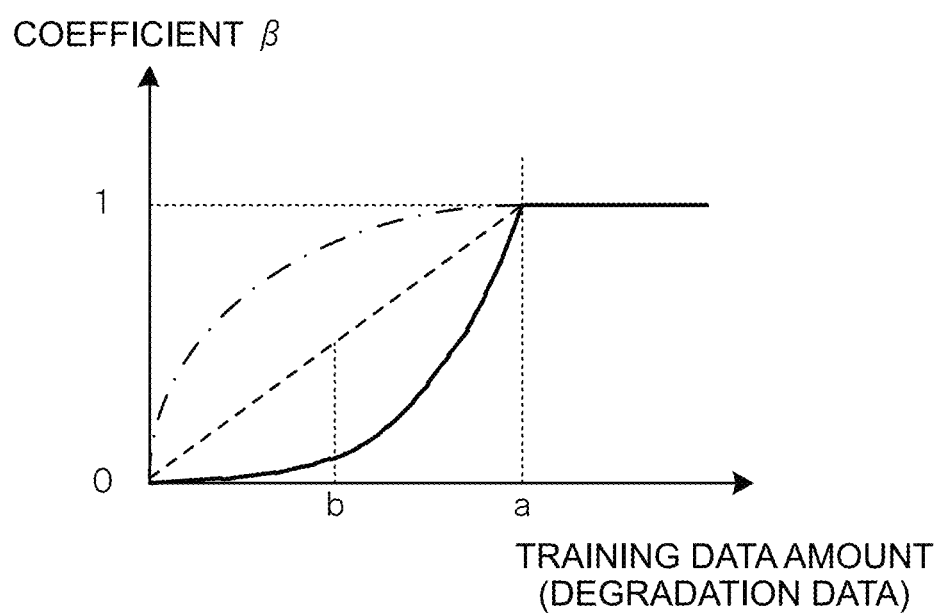
FIG. 11 is a diagram for describing an example of calculating a final degradation probability using both an initial period degradation probability calculation method and a later period degradation probability calculation method.

Based on the calculation results serving as derivation results from the probability calculation section 42, the degradation evaluation section 44 evaluates whether the battery 20 has degraded by making a determination as to whether the state quantity meets a pre-specified degrading condition. For example, the degradation evaluation section 44 evaluates degradation by making a determination as to whether a probability of degrading calculated by the probability calculation section 42 is at least a pre-specified threshold value. In the present exemplary embodiment, as with the first training data replacement shown in FIG. 4, in the initial period when there is little training data obtained from degrading data of the evaluation object vehicles, the degradation evaluation section 44 evaluates degradation of the battery 20 based on a combined degradation probability for the short period and medium period that is calculated from the long-term degradation probability. That is, the degradation evaluation section 44 calculates 100 minus the long-term degradation probability to evaluate the degradation of the battery 20. Alternatively, as with the second training data replacement shown in FIG. 4, when the training data obtained from degrading data of the evaluation object vehicles has increased, the degradation evaluation section 44 evaluates degradation of the battery 20 based on the short-term degradation probability. In the present exemplary embodiment, an example is described in which, depending on amounts of training data, the evaluation of degradation of the battery 20 is based on a degradation probability calculated from the long-term degradation probability or on the short-term degradation probability, but this is not limiting. For example, both a degradation probability calculated from the long-term degradation probability (100 minus the long-term degradation probability) and the short-term degradation probability may be used to calculate a final probability of degrading for evaluating degradation of the battery 20. For example, as illustrated in FIG. 11, a coefficient β that serves as a weighting is set in advance in accordance with an amount of training data, and the probability of degrading is calculated from $(1−β)×$(short-term degradation probability)$+β×$(100−long-term degradation probability). FIG. 11 depicts an example for the coefficient β in which the coefficient β increases quadratically with increasing amounts of training data, but this is not limiting. As shown by the dotted line in FIG. 11, the coefficient β may increase linearly. Alternatively, as shown by the single-dot chain line in FIG. 11, the coefficient β may increase in a negative quadratic manner. A configuration in which the coefficient β is set to zero until the amount of training data reaches a pre-specified threshold a and the coefficient β is set to 1 when the amount of training data equals or exceeds a also corresponds with the present exemplary embodiment.

The data output section 46 sends an evaluation result from the degradation evaluation section 44 to the on-board device 16 of the vehicle 14 from which the state quantity was acquired. Hence, a degradation evaluation result of the battery 20 may be reported by the on-board device 16.

Herein, the battery information acquisition section 22 or data reception section 30 corresponds to an acquisition section, the probability calculation section 42 corresponds to a derivation section, and the degradation evaluation section 44 corresponds to an evaluation section.

Now, specific processing that is carried out at the center 12 of the battery degradation evaluation system 10 according to the present exemplary embodiment configured as described above is described.

Figure 6:
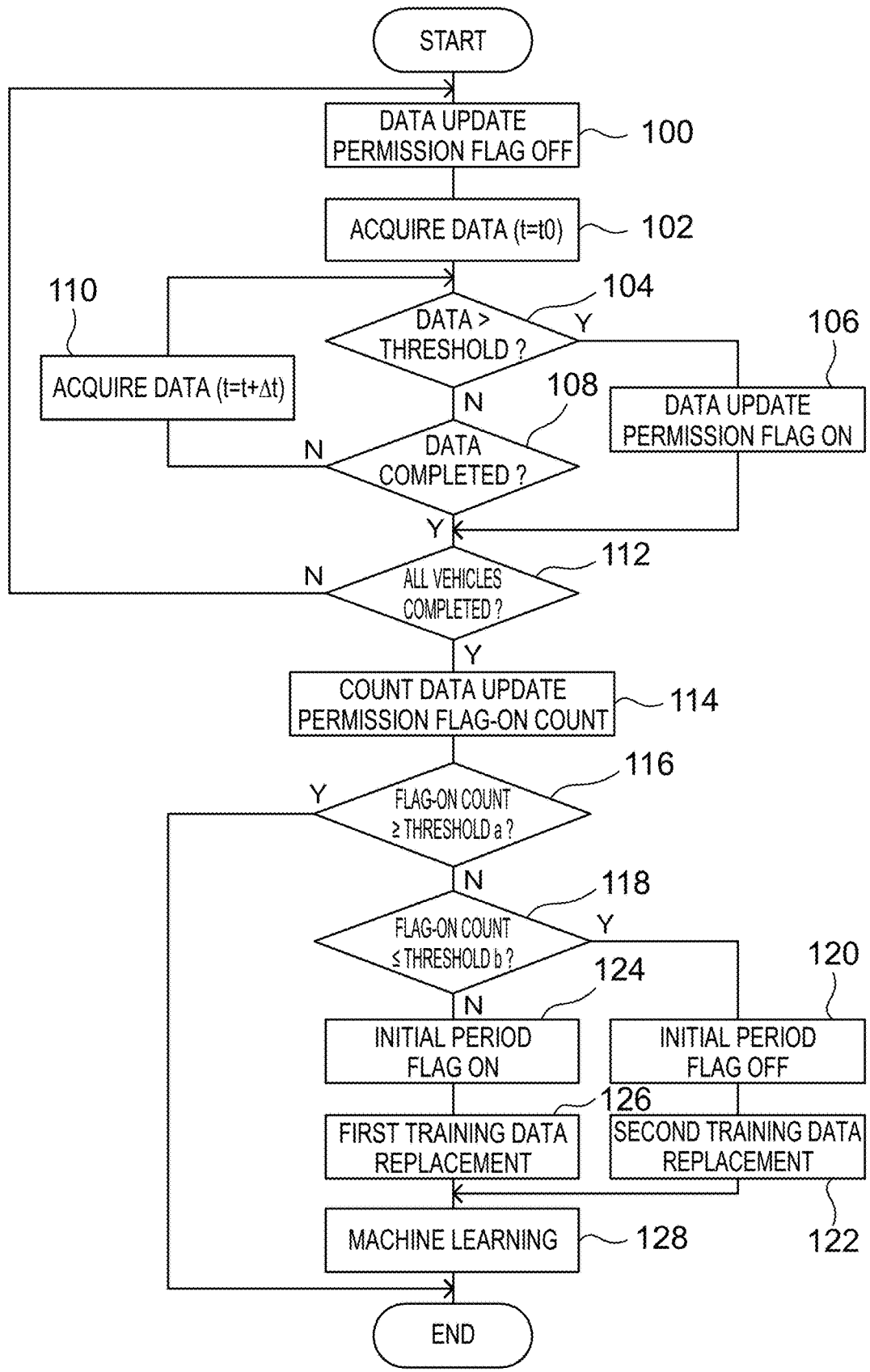
FIG. 6 is a flowchart showing an example of a flow of processing that is carried out by a data update section of the center of the battery degradation evaluation system according to the present exemplary embodiment.

FIG. 6 is a flowchart showing an example of a flow of processing that is carried out by the data update section 32 of the center 12 of the battery degradation evaluation system 10 according to the present exemplary embodiment. The processing in FIG. 6 may start, for example, at pre-specified time intervals, and may start each time a pre-specified number of state quantities have been gathered at the center 12. Alternatively, the processing may start when the center 12 receives a start command.

In step 100, the data update permission judgment section 34 sets a data update permission flag to off, and the data update section 32 proceeds to step 102.

In step 102, the data update permission judgment section 34 acquires state quantity data received by the data reception section 30, and the data update section 32 proceeds to step 104. The data update permission judgment section 34 acquires one item of data (for example, data for a time t=t0) from the state quantity data received from a particular vehicle.

In step 104, the data update permission judgment section 34 makes a determination as to whether the acquired state quantity data exceeds a pre-specified threshold. This determination is a determination as to whether the battery 20 may have degraded. When the result of this determination is affirmative, the data update section 32 proceeds to step 106, and when the result is negative, the data update section 32 proceeds to step 108.

In step 106, the data update permission judgment section 34 sets the data update permission flag to on, and the data update section 32 proceeds to step 112.

Alternatively, in step 108, the data update permission judgment section 34 makes a determination as to whether the processing described above has been completed for all data from the particular vehicle 14. When the result of this determination is negative, the data update section 32 proceeds to step 110, and when the result is affirmative, the data update section 32 proceeds to step 112.

In step 110, the data update permission judgment section 34 acquires the next data (for example, data for a subsequent time t=t+Δt) from the state quantity data acquired from the particular vehicle, and the data update section 32 proceeds to step 104.

In step 112, the data update permission judgment section 34 makes a determination as to whether the processing described above has been completed for all vehicles. When the result of this determination is negative, the data update section 32 returns to step 100 and repeats the processing described above, and when the result is affirmative, the data update section 32 proceeds to step 114.

In step 114, the data creation section 36 counts the number of times the data update permission flag has been set to on, and the data update section 32 proceeds to step 116.

In step 116, the data creation section 36 makes a determination as to whether the flag-on count is more than a pre-specified threshold a. This determination is a determination as to whether the flag-on count is at least the maximum value a of the training data, which is specified as in FIG. 3. When the result of this determination is affirmative, this sequence of processing by the data update section 32 ends, and when the result is negative, the data update section 32 proceeds to step 118.

In step 118, the data creation section 36 makes a determination as to whether the flag-on count is less than a pre-specified threshold b. This determination is a determination as to whether the flag-on count is at most the minimum value b of the training data, which is specified as in FIG. 3. When the result of this determination is affirmative, the data update section 32 proceeds to step 120, and when the result is negative, the data update section 32 proceeds to step 124.

In step 120, the data creation section 36 sets an initial period flag to off, and the data update section 32 proceeds to step 122.

In step 122, the data creation section 36 switches to the second training data replacement described in FIG. 4, the data creation section 36 implements a replacement of training data, and the data update section 32 proceeds to step 128.

Alternatively, in step 124 the data creation section 36 sets the initial period flag to on, and the data update section 32 proceeds to step 126.

In step 126, the data creation section 36 switches to the first training data replacement described in FIG. 4, the data creation section 36 implements a replacement of training data, and the data update section 32 proceeds to step 128.

In step 128, the data creation section 36 uses the training data after the replacement to conduct machine learning and update the data map, and the data update section 32 ends this sequence of processing.

Figure 7:
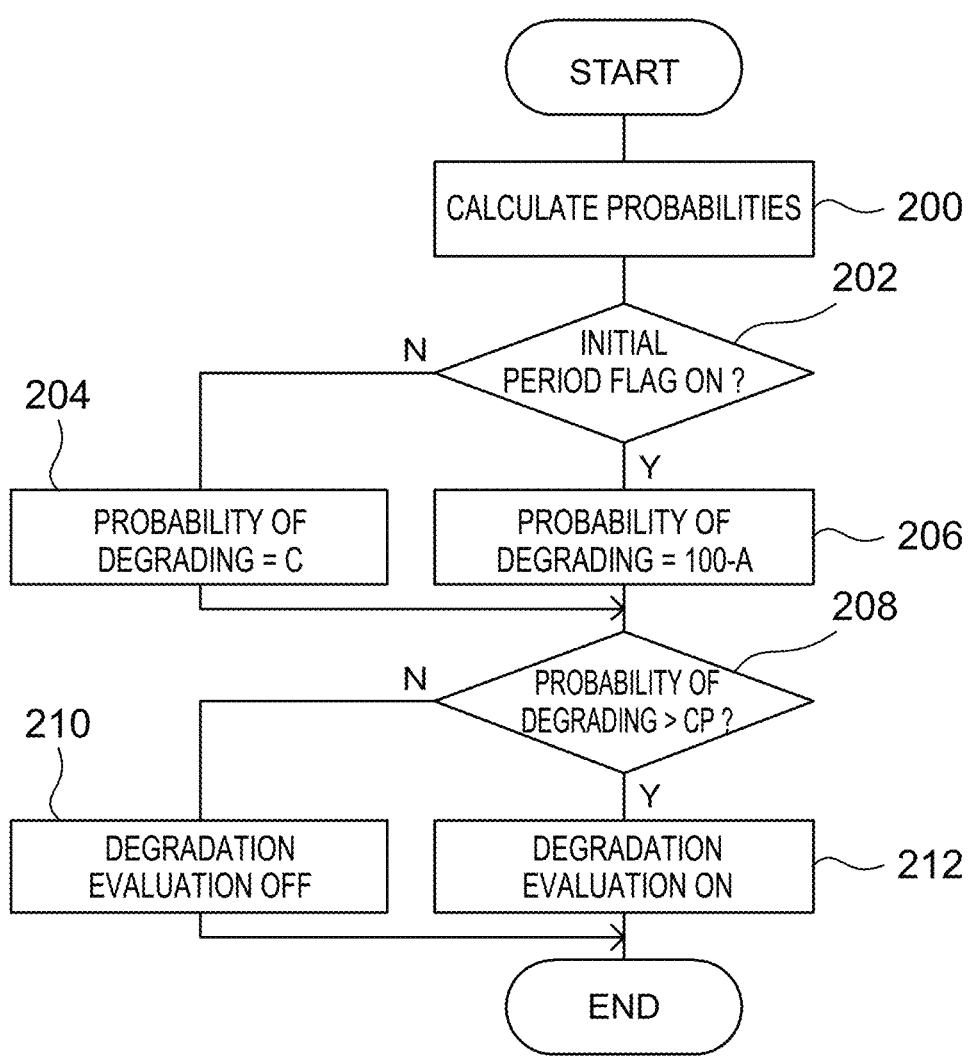
FIG. 7 is a flowchart showing an example of a flow of processing that is carried out by a data operations section of the center of the battery degradation evaluation system according to the present exemplary embodiment.

Now, processing that is carried out by the data operations section 40, which is carried out following the processing by the data update section 32, is described. FIG. 7 is a flowchart showing an example of a flow of the processing carried out by the data operations section 40 of the center 12 of the battery degradation evaluation system 10 according to the present exemplary embodiment. The processing in FIG. 7 starts, for example, when the processing by the data update section 32 in FIG. 6 ends.

In step 200, the probability calculation section 42 calculates degradation probabilities of the battery 20, and the data operations section 40 proceeds to step 202. That is, the data map created beforehand is used to calculate the degradation probabilities, with the state quantity of the battery 20 as an input. Three kinds of degradation probability are calculated in the present exemplary embodiment: the short-term degradation probability, the medium-term degradation probability and the long-term degradation probability.

In step 202, the probability calculation section 42 makes a determination as to whether the initial period flag is on. That is, the probability calculation section 42 makes a determination as to whether the initial period flag has been set to on in step 124 at the data creation section 36. When the result of this determination is negative, the data operations section 40 proceeds to step 204, and when the result is affirmative, the data operations section 40 proceeds to step 206.

In step 204, the probability calculation section 42 employs the short-term degradation probability C as a probability of degrading, and the data operations section 40 proceeds to step 208.

Alternatively, in step 206 the probability calculation section 42 employs 100 minus the long-term degradation probability A as the probability of degrading (in other words, a probability of not degrading until the long term), and the data operations section 40 proceeds to step 208.

In step 208, the degradation evaluation section 44 makes a determination as to whether the calculated probability of degrading is greater than a pre-specified threshold CP. When the result of this determination is negative, the data operations section 40 proceeds to step 210, and when the result is affirmative, the data operations section 40 proceeds to step 212.

In step 210, the degradation evaluation section 44 evaluates that the battery is not degrading and sets degradation evaluation to off, and this sequence of processing by the data operations section 40 ends.

Alternatively, in step 212, the degradation evaluation section 44 evaluates that the battery is degrading and sets the degradation evaluation to on, and this sequence of processing by the data operations section 40 ends.

Figure 8:
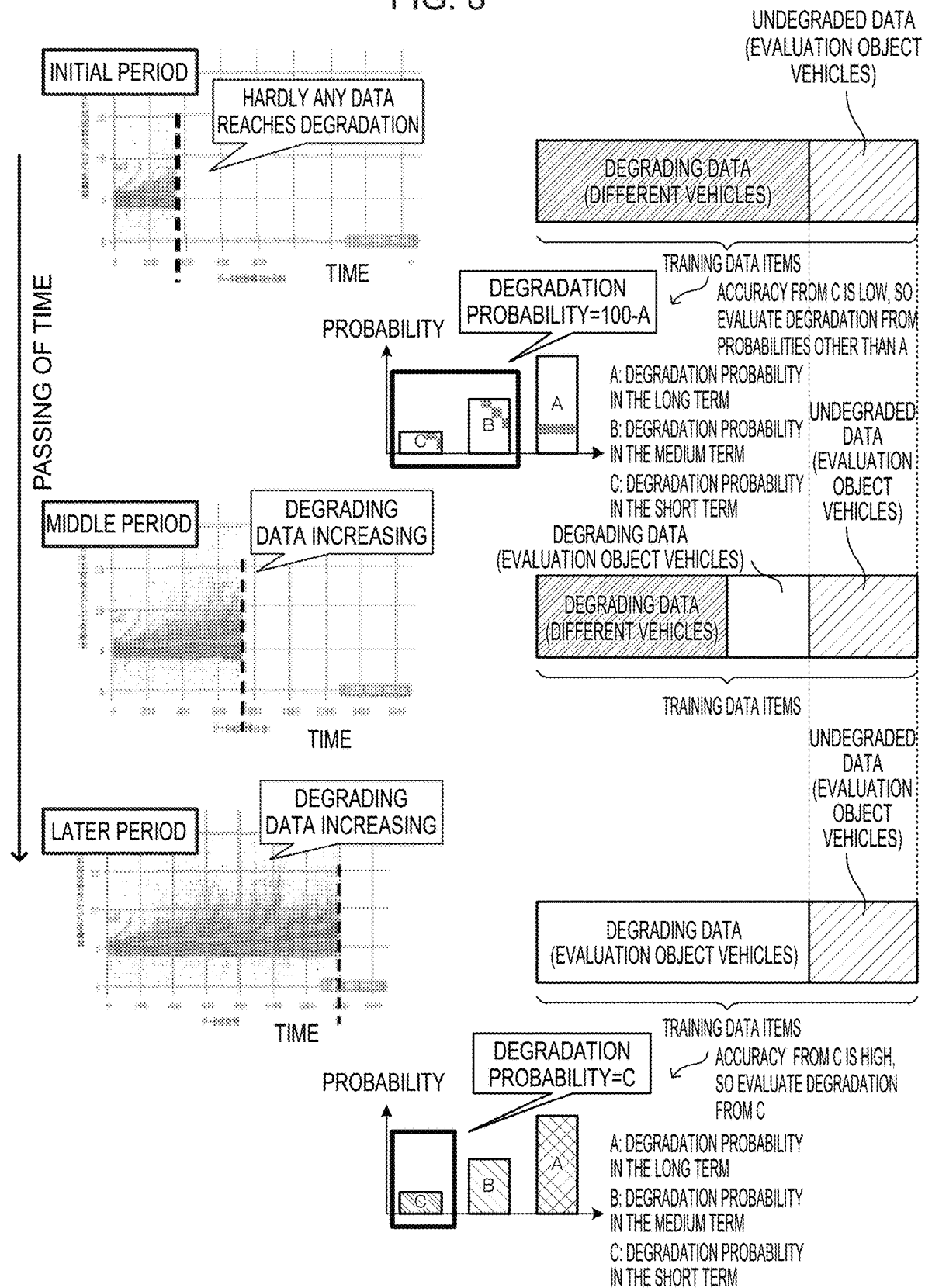
FIG. 8 is a diagram illustrating a method for evaluating degradation as time passes in the battery degradation evaluation system according to the present exemplary embodiment.

Because the processing described above is carried out in the present exemplary embodiment, in the initial period in which there is little training data obtained from degrading data of the evaluation object vehicles, degradation of the battery 20 is evaluated using long-term degradation probabilities (probabilities of not degrading until the long period), as shown in FIG. 8. That is, as shown in FIG. 8, 100 minus the long-term degradation probability A is calculated for evaluating degradation of the battery 20. Thus, the accuracy of degradation evaluation may be improved compared to a situation in which degradation is evaluated using short-term degradation probabilities in the initial period.

As is further shown in FIG. 8, as training data obtained from degrading data of the evaluation object vehicles steadily increases and a later period is entered, the model accuracy of short-term degradation probabilities improves. Therefore, degradation of the battery 20 is evaluated using short-term degradation probabilities C. Thus, the accuracy of degradation evaluation may be improved compared to a situation in which degradation is evaluated using long-term degradation probabilities.

In the present exemplary embodiment, model accuracy in the initial period, in which there is little training data from the evaluation object vehicles, may be improved by conducting machine learning using training data from other vehicles in the initial period. Hence, as the training data obtained from degrading data of the evaluation object vehicles increases, the model accuracy may be steadily brought into conformance with the evaluation object vehicles by conducting machine learning with training data from the evaluation object vehicles replacing the training data from the other vehicles.

In the exemplary embodiment described above, voltage, resistance, temperature and the like of the battery 20 are mentioned as examples of the state quantity, but the state quantity is not limited thus. For example, a current or power relating to the battery 20, a two-dimensionally obtained state of charge (SOC) or the like, or a quantity in which these quantities are multiplied or added may prospectively be the state quantity. A prospective state quantity that is employed may be a single quantity and may be plural quantities. Which state quantity is most appropriate may vary in accordance with conditions, required accuracy and the like. Accordingly, it is sufficient to select the state quantity as appropriate.

Figure 9:
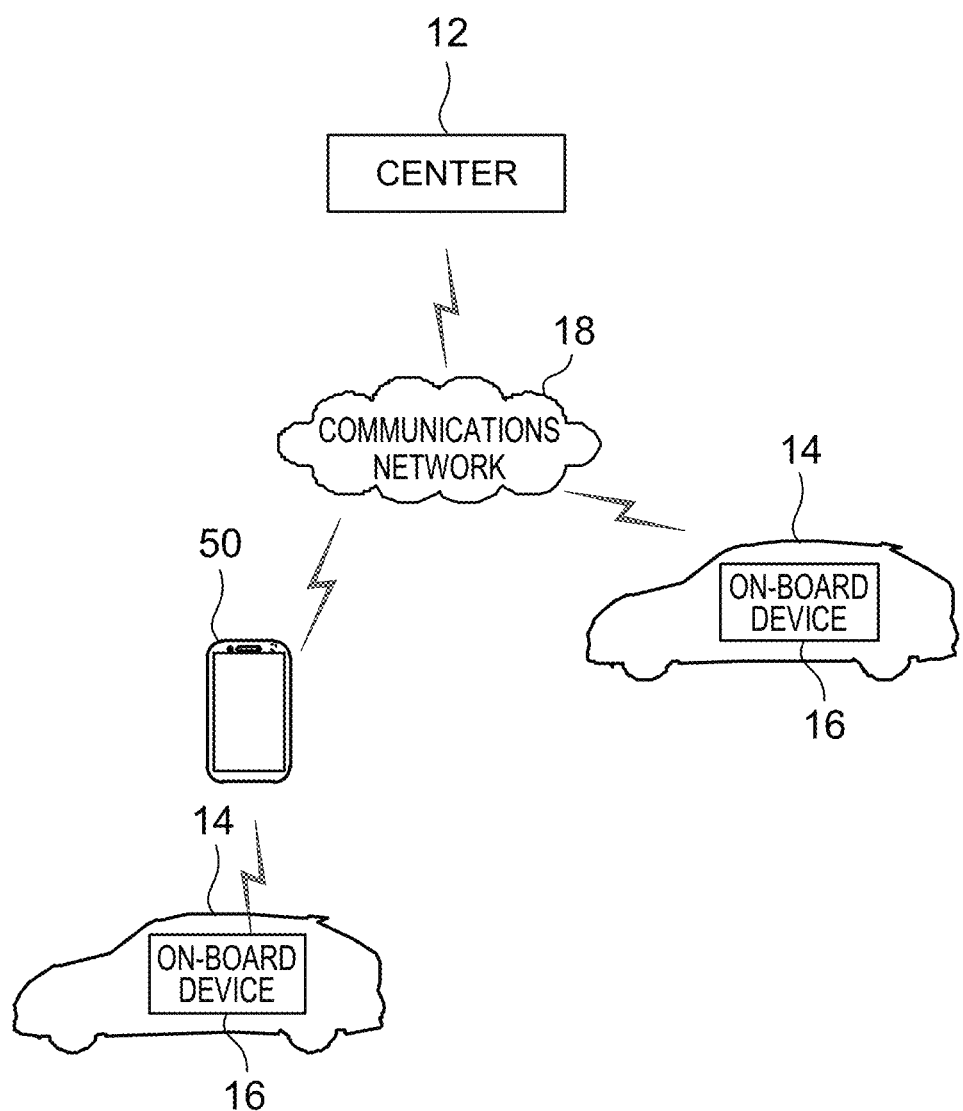
FIG. 9 is a diagram showing schematic structures of a degradation evaluation system when a portable terminal is employed as a communications device.
Figure 10:
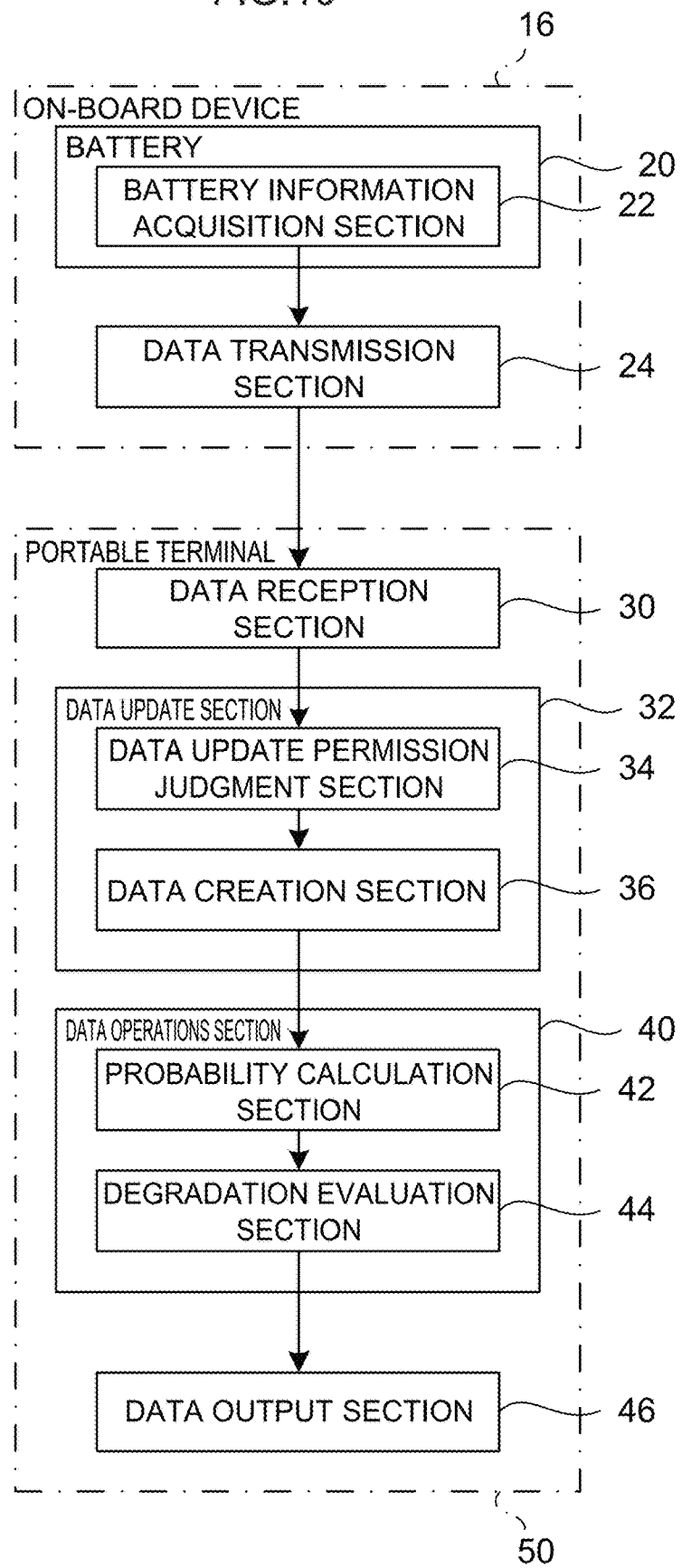
FIG. 10 is a block diagram showing functional structures of a portable terminal equipped with functions of the center.

In the exemplary embodiment described above, an example is described in which a communications device is provided at the vehicle 14 for communicating with the center 12, but this is not limiting. For example, as shown in FIG. 9, a portable terminal 50 such as a smartphone carried by a vehicle occupant or the like may be employed as the communications device. Alternatively, as shown in FIG. 10, the functions of the center 12 shown in FIG. 2 may be provided at the portable terminal 50, and processing to evaluate degradation of the battery 20 may be carried out by the portable terminal 50. In this configuration, the portable terminal 50 is equipped with hardware structures similar to the hardware structures of the center 12, as shown in FIG. 13.

In the exemplary embodiment described above, an example is described in which degradation of the battery 20 is evaluated using big data and machine learning based on an AI model that serves as the pre-specified computation model, but this is not limiting. For example, an evaluation method may be employed that uses single regression analysis, multiple regression analysis or the like. Alternatively, a degradation evaluation method may be employed that uses small-quantity data and a physical model that serves as the pre-specified computation model. Alternatively again, a degradation evaluation method may be employed that uses both machine learning and a physical model that serves as the pre-specified computation model.

Figure 12:
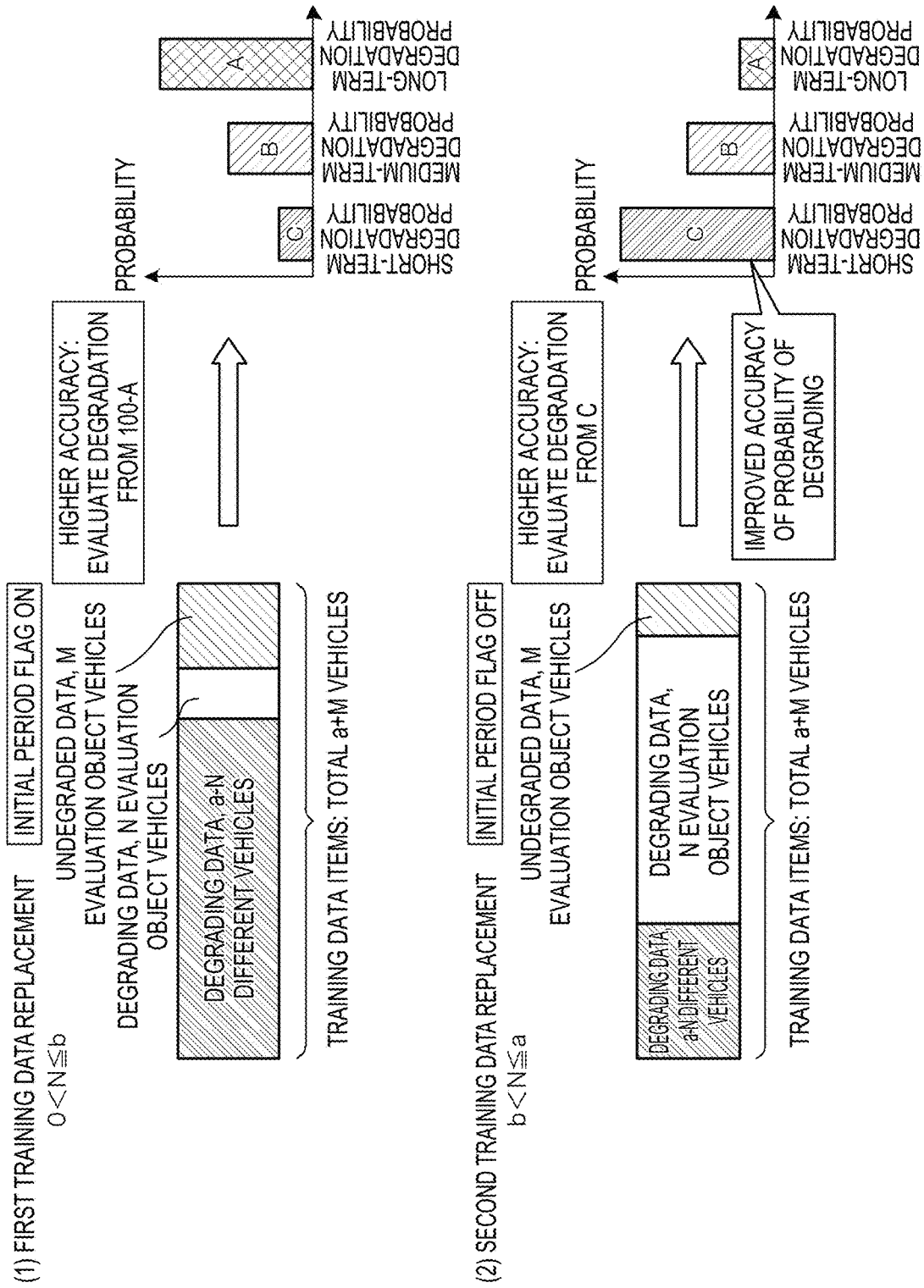
FIG. 12 is a diagram illustrating an example in which undegraded data used for machine learning is decreased and degrading data is increased.

In the exemplary embodiment described above, an example is described in which undegraded data from the beginning is retained, but this is not limiting. For example, in order to reduce machine learning loads, degrading data may be increased and undegraded data may be decreased, as shown in FIG. 12.

The processing executed by the center 12 according to the exemplary embodiment described above is described as software processing that is implemented by a program being executed, but this is not limiting. For example, the processing may be carried out by hardware such as a graphics processing unit (GPU), application-specific integrated circuit (ASIC), field-programmable gate array (FPGA) or the like. Alternatively, the processing may combine both software and hardware. Further, if the processing is implemented in software, the program may be memorized in any of various non-transitory storage media and distributed.

The present disclosure is not limited by the above recitations. In addition to the above recitations, it will be clear that numerous modifications may be embodied within a technical scope not departing from the gist of the disclosure.

What is claimed is:

1. A battery degradation evaluation system comprising a memory, a processor coupled to the memory, a battery, and a voltage sensor, the processor being configured to:
   acquire state quantities of the battery mounted at a vehicle;
   based on the state quantities and a pre-specified computation model, derive a plurality of probabilities of the battery degrading respectively corresponding to each length of a plurality of pre-specified terms;
   evaluate degradation of the battery based on results of deriving the degradation probabilities, by:
   changing weighting for the plurality of probabilities of the battery degrading in accordance with the number of state quantities being used as data for learning of the computation model; wherein the state quantities are acquired from the voltage sensor, which is mounted at the vehicle and assesses voltages of the battery.

2. The battery degradation evaluation system according to claim 1, wherein the processor is configured to:
   in a case in which the number of state quantities is less than a pre-specified threshold, evaluate degradation of the battery based on a combined degradation probability for a pre-specified short period and a medium period, which is longer than the pre-specified short period that is calculated from a long-term degradation probability, which is longer than the medium period; and,
   in a case in which the number of state quantities is equal to or greater than the threshold, evaluate degradation of the battery based on the pre-specified short-term degradation probability.

3. The battery degradation evaluation system according to claim 1, wherein the processor is configured such that:
   once the computation model starts learning, the computation model conducts learning with training data including state quantities of a degrading battery mounted at a different vehicle that is different from an evaluation object vehicle and state quantities of an undegraded battery at the evaluation object vehicle; and,
   in accordance with progress of learning, the computation model conducts learning with state quantities of the degrading battery at the evaluation object vehicle replacing state quantities of the battery mounted at the different vehicle in the learning data.

4. The battery degradation evaluation system according to claim 3, wherein the processor is configured such that, in accordance with the progress of learning, the computation model conducts learning with an increased number of the state quantities of the degrading battery at the evaluation object vehicle and a decreased number of the state quantities of the undegraded battery at the evaluation object vehicle.

5. A battery degradation evaluation system comprising a memory, a processor coupled to the memory, a battery, and a resistance sensor, the processor being configured to:
   acquire state quantities of the battery mounted at a vehicle;
   based on the state quantities and a pre-specified computation model, derive a plurality of probabilities of the battery degrading respectively corresponding to each length of a plurality of pre-specified terms;
   evaluate degradation of the battery based on results of deriving the degradation probabilities, by:
   changing weighting for the plurality of probabilities of the battery degrading in accordance with the number of state quantities being used as data for learning of the computation model; wherein the state quantities are acquired from the resistance sensor, which is mounted at the vehicle and assesses a resistance of the battery.

6. The battery degradation evaluation system according to claim 5, wherein the processor is configured to:
   in a case in which the number of state quantities is less than a pre-specified threshold, evaluate degradation of the battery based on a combined degradation probability for a pre-specified short period and a medium period, which is longer than the pre-specified short period that is calculated from a long-term degradation probability, which is longer than the medium period; and,
   in a case in which the number of state quantities is equal to or greater than the threshold, evaluate degradation of the battery based on the pre-specified short-term degradation probability.

7. The battery degradation evaluation system according to claim 5, wherein the processor is configured such that:
   once the computation model starts learning, the computation model conducts learning with training data including state quantities of a degrading battery mounted at a different vehicle that is different from an evaluation object vehicle and state quantities of an undegraded battery at the evaluation object vehicle; and,
   in accordance with progress of learning, the computation model conducts learning with state quantities of the degrading battery at the evaluation object vehicle replacing state quantities of the battery mounted at the different vehicle in the learning data.

8. The battery degradation evaluation system according to claim 7, wherein the processor is configured such that, in accordance with the progress of learning, the computation model conducts learning with an increased number of the state quantities of the degrading battery at the evaluation object vehicle and a decreased number of the state quantities of the undegraded battery at the evaluation object vehicle.

9. A battery degradation evaluation system comprising a memory, a processor coupled to the memory, a battery, and a temperature sensor, the processor being configured to:
acquire state quantities of the battery mounted at a vehicle;
based on the state quantities and a pre-specified computation model, derive a plurality of probabilities of the battery degrading respectively corresponding to each length of a plurality of pre-specified terms;
evaluate degradation of the battery based on results of deriving the degradation probabilities, by:
changing weighting for the plurality of probabilities of the battery degrading in accordance with the number of state quantities being used as data for learning of the computation model; wherein the state quantities are acquired from the temperature sensor, which is mounted at the vehicle and assesses temperatures of the battery.

10. The battery degradation evaluation system according to claim 9, wherein the processor is configured to;
in a case in which the number of state quantities is less than a pre-specified threshold, evaluate degradation of the battery based on a combined degradation probability for a pre-specified short period and a medium period, which is longer than the pre-specified short period that is calculated from a long-term degradation probability, which is longer than the medium period; and,
in a case in which the number of state quantities is equal to or greater than the threshold, evaluate degradation of the battery based on the pre-specified short-term degradation probability.

11. The battery degradation evaluation system according to claim 9, wherein the processor is configured such that:
once the computation model starts learning, the computation model conducts learning with training data including state quantities of a degrading battery mounted at a different vehicle that is different from an evaluation object vehicle and state quantities of an undegraded battery at the evaluation object vehicle; and,
in accordance with progress of learning, the computation model conducts learning with state quantities of the degrading battery at the evaluation object vehicle replacing state quantities of the battery mounted at the different vehicle in the learning data.

12. The battery degradation evaluation system according to claim 11, wherein the processor is configured such that, in accordance with the progress of learning, the computation model conducts learning with an increased number of the state quantities of the degrading battery at the evaluation object vehicle and a decreased number of the state quantities of the undegraded battery at the evaluation object vehicle.

* * * * *